United States Patent
Hwang (12)

(10) Patent No.: US 10,783,097 B1
(45) Date of Patent: Sep. 22, 2020

(54) RECEIVER, RECEIVING CIRCUIT, SEMICONDUCTOR APPARATUS, AND SEMICONDUCTOR SYSTEM INCLUDING THE RECEIVER

(71) Applicant: SK hynix Inc., Icheon-si Gyeonggi-do (KR)

(72) Inventor: Kyu Dong Hwang, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/712,745

(22) Filed: Dec. 12, 2019

(30) Foreign Application Priority Data

Jun. 21, 2019 (KR) .................. 10-2019-0074037

(51) Int. Cl.
*G06F 13/16* (2006.01)
*H03K 19/0185* (2006.01)
*G06F 13/40* (2006.01)

(52) U.S. Cl.
CPC .......... *G06F 13/1668* (2013.01); *G06F 13/40* (2013.01); *H03K 19/018521* (2013.01)

(58) Field of Classification Search
CPC ................ G06F 12/1668; G06F 13/40; H03K 19/018521
See application file for complete search history.

(56) References Cited

U.S. PATENT DOCUMENTS

| 2002/0180516 | A1  | 12/2002 | Harrison |
| 2007/0273406 | A1* | 11/2007 | Kang ............... H03K 19/01856 326/83 |
| 2011/0182130 | A1  | 7/2011  | Cowles et al. |
| 2014/0269130 | A1* | 9/2014  | Maeng ................. G11C 7/1084 365/207 |

\* cited by examiner

*Primary Examiner* — Sung S Ahn
(74) *Attorney, Agent, or Firm* — William Park & Associates Ltd.

(57) ABSTRACT

A receiver includes an amplification circuit and a compensation circuit. The amplification circuit changes a voltage level of a first output node based on an input signal and changes a voltage level of a second output node based on a reference voltage. The compensation circuit changes the voltage level of the second output node based on the input signal and changes the voltage level of the first output node based on the reference voltage. The amplification circuit includes first type transistors configured to receive the input signal and the reference voltage. The compensation circuit includes second type transistors configured to receive the input signal and the reference voltage.

29 Claims, 4 Drawing Sheets

RECEIVER, RECEIVING CIRCUIT, SEMICONDUCTOR APPARATUS, AND SEMICONDUCTOR SYSTEM INCLUDING THE RECEIVER

CROSS-REFERENCES TO RELATED APPLICATION

The present application claims priority under 35 U.S.C. § 119(a) to Korean application number 10-2019-0074037, filed on Jun. 21, 2019, in the Korean Intellectual Property Office, which is incorporated herein by reference in its entirety.

BACKGROUND

1. Technical Field

Various embodiments relate to an integrated circuit technology and, more particularly, to a receiver and a receiving circuit, a semiconductor apparatus and a semiconductor system including the receiver.

2. Related Art

An electronic device includes a lot of electronic elements, and a computer system includes various semiconductor apparatuses, each comprising a semiconductor. Semiconductor apparatuses, configuring a computer system, may communicate with each other by receiving and transmitting a control signal, a clock signal, and data. A semiconductor apparatus includes a receiver and receives a signal, transmitted from another semiconductor apparatus and receives a signal from the internal circuits thereof. The receiver performs a differential amplification operation. The receiver receives a differential signal and a single-ended signal. The receiver utilizes a reference voltage to amplify the single-ended signal. The receiver is required to keep a predetermined common mode for a precise amplification operation. However, it is hard to keep the predetermined common mode corresponding to a single-ended signal having an arbitrary pattern, within a receiver that does not utilize termination for a low power operation or a receiver that is configured by a single stage.

SUMMARY

In an embodiment, a receiver may include a first enablement circuit, an input circuit, a current circuit, and a compensation circuit. The first enablement circuit may be configured to couple a node, which receives a first power voltage is, and a first common node to each other. The input circuit, coupled between the first common node and a first output node and a second output node, may be configured to change a voltage level of the first output node based on an input signal and change a voltage level of the second output node based on a reference voltage. The current circuit may be configured to allow the same amount of currents to flow through the first output node and the second output node. The compensation circuit may be configured to receive the first power voltage through a second common node, configured to couple the second common node to the second output node based on the input signal, and configured to couple the second common node to the first output node based on the reference voltage.

In an embodiment, a receiver may include a first input transistor, a second input transistor, a resistive element, a current circuit, a first compensation transistor, and a second compensation transistor. The first input transistor may be configured to receive an input signal and may be configured to change a voltage level of a first output node. The second input transistor may be configured to receive a reference voltage and may be configured to change a voltage level of a second output node. The resistive element may be configured to couple a node, which receives a first power voltage is, to the first and second input transistors. The current circuit may be configured to provide the first output node and the second output node with a second power voltage. The first compensation transistor may be configured to change the voltage level of the first output node based on the reference voltage. The second compensation transistor may be configured to change the voltage level of the second output node based on the input signal.

In an embodiment, a receiver may include an amplification circuit and a compensation circuit. The amplification circuit, including first type transistors, may be configured to receive an input signal and a reference voltage, configured to change a voltage level of a first output node based on the input signal, and configured to change a voltage level of a second output node based on the reference voltage. The compensation circuit, including second type transistors, may be configured to receive the input signal and the reference voltage, configured to change the voltage level of the second output node based on the input signal, and configured to change the voltage level of the first output node based on the reference voltage.

In an embodiment, a receiving circuit may include a first receiver and a second receiver. The first receiver may be configured to generate, in a low-frequency mode, a reception signal by differentially amplifying an input signal and a reference voltage. The second receiver may be configured to generate, in a high-frequency mode, the reception signal by differentially amplifying the input signal and the reference voltage. The first receiver may include an amplification circuit, a compensation circuit, and a slicer. The amplification circuit may be configured to change a voltage level of an output signal based on the input signal and change a voltage level of a complementary output signal based on the reference voltage. The compensation circuit may be configured to change the voltage level of the output signal based on the reference voltage and change the voltage level of the complementary output signal based on the input signal. The slicer may be configured to generate the reception signal by inversely driving the output signal.

DETAILED DESCRIPTION

Hereinafter, a semiconductor apparatus based on the various embodiments will be described below with reference to the accompanying drawings through various embodiments.

Specific structural or functional descriptions of embodiments based on the concept which are disclosed in the present specification or application are illustrated only to describe the embodiments based on the concept of the present disclosure. The embodiments based on the concept of the present disclosure may be carried out in various forms and the descriptions are not limited to the embodiments described in the present specification or application.

Since various modifications and changes may be applied to the embodiment based on the concept of the present disclosure and the embodiment based on the concept of the present disclosure may have various forms, the specific embodiments will be illustrated in the drawings and described in the present specification or application. However, it should be understood that the embodiment based on the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope based on the concept of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "~ between," "immediately ~ between" or "adjacent to ~", "directly adjacent to ~", and the like should be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art which receives the present disclosure pertains. The terms defined in generally used dictionaries should be construed as having the same meanings as would be construed in the context of the related art, and unless clearly defined otherwise in the present specification, should not be construed as having idealistic or excessively formal meanings.

Figure 1:
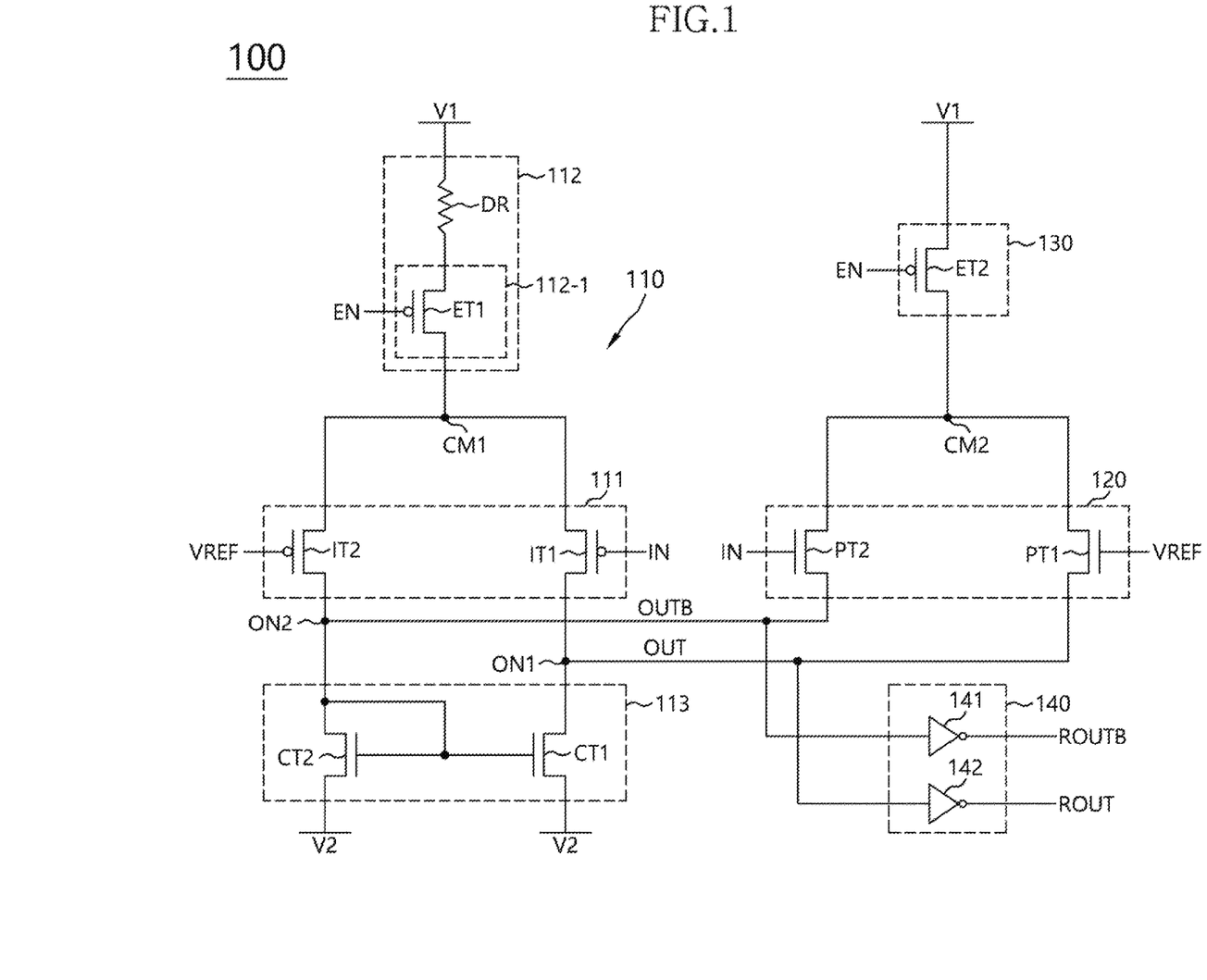
FIG. 1 is a schematic diagram, illustrating a configuration of a receiver, in accordance with an embodiment.

FIG. 1 is a schematic diagram, illustrating a configuration of a receiver 100, in accordance with an embodiment. Referring to FIG. 1, the receiver 100 may receive an input signal IN and may generate an output signal OUT. The input signal IN may be a signal, provided from a source, outside of the semiconductor apparatus, including the receiver 100 or may be a signal, provided from another circuit included in the semiconductor apparatus. The input signal IN may be a single-ended signal. The receiver 100 may utilize the reference voltage VREF, in order to receive the single-ended signal. In order to detect a logic level of the input signal IN, the reference voltage VREF may have a voltage level, corresponding to the middle of the swing range of the input signal IN. The reference voltage VREF may be provided from a source, outside of the semiconductor apparatus, or may be generated by an internal voltage generator and/or a reference voltage generator, included in the semiconductor apparatus.

The receiver 100 may include an amplification circuit 110 and a compensation circuit 120. The amplification circuit 110 may receive the input signal IN and the reference voltage VREF and may generate the output signal OUT based on the input signal IN and the reference voltage VREF. The amplification circuit 110 may generate a complementary output signal OUTB together with the output signal OUT. The amplification circuit 110 may change a voltage level of a first output node ON1 based on the input signal IN. The amplification circuit 110 may change a voltage level of a second output node ON2 based on the reference voltage VREF. The output signal OUT may be output from the first output node ON1, and the complementary output signal OUTB may be output from the second output node ON2. The amplification circuit 110 may be coupled between the node, which receives the first power voltage V1, and a node, which receives the second power voltage V2; and may differentially amplify the input signal IN and the reference voltage VREF. The first power voltage V1 may have a higher voltage level than the second power voltage V2.

The amplification circuit 110 may include first type transistors, configured to receive the input signal IN and the reference voltage VREF. For example, each of the first type transistors may be a P-channel MOS transistor. The amplification circuit 110 may raise the voltage level of the second output node ON2, with reference to the voltage level of the first output node ON1, when the input signal IN has a logic high level. Furthermore, the amplification circuit 110 may raise the voltage level of the first output node ON1, with reference to the voltage level of the second output node ON2, when the input signal IN has a logic low level.

The compensation circuit 120 may receive the input signal IN and the reference voltage VREF and may change the voltage level of the output signal OUT based on the input signal IN and the reference voltage VREF. The compensation circuit 120 may receive the first power voltage V1 and may change the voltage levels of the first output node ON1 and the second output node ON2 based on the input signal IN and the reference voltage VREF. The compensation circuit 120 may change the voltage level of the second output node ON2 based on the input signal IN and may change the voltage level of the first output node ON1 based on the reference voltage VREF. The compensation circuit 120 may be coupled between a second common node CM2 and the first and second output nodes ON1 and ON2. The compensation circuit 120 may receive the first power voltage V1 through the second common node CM2. The compensation circuit 120 may electrically couple the second common node CM2 to the first output node ON1 based on the reference voltage VREF. The compensation circuit 120 may electrically couple the second common node CM2 to the second output node ON2 based on the input signal IN. The compensation circuit 120 may pull-up drive the second output node ON2 when the input signal IN has a logic high level. The compensation circuit 120 may pull-up drive the first output node ON1 when the input signal IN has a logic low level.

The compensation circuit 120 may include second type transistors, configured to receive the input signal IN and the reference voltage VREF. The second type transistors may be complementary to the first type transistors. For example, the first type transistors and the second type transistors structurally mirror each other. When the input signal IN swings within a range of a relatively low voltage level, each of the first type transistors may be a P-channel MOS transistor, and each of the second type transistors may be a N-channel MOS transistor. In an embodiment, when the input signal IN swings within a range of a relatively high voltage level, each of the first type transistors may be a N-channel MOS transistor and each of the second type transistors may be a P-channel MOS transistor.

Referring to FIG. 1, the amplification circuit 110 may include an input circuit 111, a first enablement circuit 112 and a current circuit 113. The input circuit 111 may receive the input signal IN and the reference voltage VREF and may change the voltage levels of the first output node ON1 and the second output node ON2 based on the input signal IN and the reference voltage VREF. The input circuit 111 may be coupled between a first common node CM1 and the first and second output nodes ON1 and ON2. The input circuit 111 may receive the first power voltage V1 through the first common node CM1. The input circuit 111 may change the voltage level of the first output node ON1 based on the input signal IN and may change the voltage level of the second output node ON2 based on the reference voltage VREF.

The first enablement circuit 112 may apply the first power voltage V1 to the first common node CM1. The first enablement circuit 112 may be coupled between the first common node CM1 and the node that the first power voltage V1 is provided to. The first enablement circuit 112 may drop the voltage level of the first power voltage V1 and may apply the dropped voltage to the first common node CM1. The first enablement circuit 112 may further receive an enablement signal EN. The enablement signal EN may be enabled to allow the receiver 100 to operate and may be enabled prior to input of the input signal IN. The first enablement circuit 112 may apply the voltage, which is dropped from the first power voltage V1, to the first common node CM1 when the enablement signal EN is enabled.

The current circuit 113 may apply the second power voltage V2 to the first output node ON1 and the second output node ON2. The current circuit 113 may be coupled between the first and second output nodes ON1 and ON2 and the node, which receives the second power voltage V2 is provided. The current circuit 113 may allow the same amount of currents to flow through the first output node ON1 and the second output node ON2. The current circuit 113 may control the amount of a current flowing from the first output node ON1 to the node, which receives the second power voltage V2, to be the same as the amount of a current flowing from the second output node ON2 to the node, which receives the second power voltage V2. The current circuit 113 may have a form of a current mirror.

The receiver 100 may further include a second enablement circuit 130. The second enablement circuit 130 may be coupled between the second common node CM2 and the node which receives the first power voltage V1. The second enablement circuit 130 may receive the enablement signal EN and may apply the first power voltage V1 to the second common node CM2 based on the enablement signal EN.

The receiver 100 may further include a slicer 140. The slicer 140 may receive the output signal OUT and may output a reception signal ROUT. The slicer 140 may generate the reception signal ROUT based on the output signal OUT. The slicer 140 may receive the complementary output signal OUTB, together with the output signal OUT, and may generate a complementary reception signal ROUTB, together with the reception signal ROUT. The slicer 140 may generate the reception signal ROUT, by inversely driving the output signal OUT, and may generate the complementary reception signal ROUTB, by inversely driving the complementary output signal OUTB.

The input circuit 111 may include a first input transistor IT1 and a second input transistor IT2. Each of the first input transistor IT1 and the second input transistor IT2 may be a P-channel MOS transistor. The first input transistor IT1 may be coupled between the first common node CM1 and the first output node ON1 and may receive the input signal IN at its gate. The first input transistor IT1 may receive the input signal IN at its gate, may be coupled to the first common node CM1 at its source, and may be coupled to the first output node ON1 at its drain. The second input transistor IT2 may be coupled between the first common node CM1 and the second output node ON2 and may receive the reference voltage VREF at its gate. The second input transistor IT2 may receive the reference voltage VREF at its gate, may be coupled to the first common node CM1 at its source, and may be coupled to the second output node ON2 at its drain. When the input signal IN has a logic low level, the first input transistor IT1 may be turned on, and the first power voltage V1 or the voltage, which is dropped from the first power voltage V1 by the first enablement circuit 112, may be applied to the first output node ON1 through the first common node CM1. Therefore, the voltage level of the first output node ON1 may rise when compared to the voltage level of the second output node ON2. When the input signal IN has a logic high level, the first input transistor IT1 may be turned off, and no current or voltage may be provided to the first output node ON1 through the first input transistor IT1. The second input transistor IT2 may provide a constant current or voltage from the first common node CM1 to the second output node ON2 based on the reference voltage VREF. Therefore, the voltage level of the first output node ON1 may lower when compared to the voltage level of the second output node ON2.

The first enablement circuit 112 may include a resistive element DR. The resistive element DR may be a degeneration resistor, configured to improve the linearity of the amplification circuit 110. The resistive element DR may electrically couple the node, which receives the first power voltage V1, to the first and second input transistors IT1 and IT2. One end of the resistive element DR may be coupled to the node, which receives the first power voltage V1. The resistive element DR may drop the voltage level of the first power voltage V1 and may provide the first and second input transistors IT1 and IT2 with the dropped voltage. The first enablement circuit 112 may further include a first enablement transistor ET1. The resistive element DR may provide the first enablement transistor ET1 with the dropped voltage. The first enablement transistor ET1 may be a P-channel MOS transistor. The first enablement transistor ET1 may be coupled between the other end of the resistive element DR and the first common node CM1; and may receive the enablement signal EN at its gate. The first enablement transistor ET1 may receive the enablement signal EN at its gate; may be coupled to the other end of the resistive element DR at its source; and may be coupled to the first common node CM1 at its drain. The enablement signal EN may be enabled to a logic low level.

The current circuit 113 may include a first current transistor CT1 and a second current transistor CT2. Each of the first current transistor CT1 and the second current transistor CT2 may be a N-channel MOS transistor. The first current transistor CT1 may be coupled between the first output node ON1 and the node, which receives the second power voltage V2, and may be coupled to the second output node ON2 at its gate. The first current transistor CT1 may be coupled to the second output node ON2 commonly at its gate and drain; and may be coupled to the node, which receives the second power voltage V2, at its source. The second current transistor CT2 may be coupled between the second output node ON2 and the node, which receives the second power voltage V2, and may be coupled to the second output node ON2 at its gate. The second current transistor CT2 may be coupled to the gate of the first current transistor CT1 at its gate; may be coupled to the first output node ON1 at its drain; and may be coupled to the node, which receives the second power voltage V2 is provided, at its source. The first current transistor CT1 and the second current transistor CT2 may allow, based on the voltage level of the second output node ON2, the same amount of currents respectively to flow from the first output node ON1 and the second output node ON2 to the node, which receives the second power voltage V2 is provided.

The compensation circuit 120 may include a first compensation transistor PT1 and a second compensation transistor PT2. The first compensation transistor PT1 and the second compensation transistor PT2 may be complementary to the first input transistor IT1 and the second input transistor IT2. Each of the first compensation transistor PT1 and the second compensation transistor PT2 may be a N-channel MOS transistor. The first compensation transistor PT1 may be coupled between the second common node CM2 and the first output node ON1 and may receive the reference voltage VREF at its gate. The first compensation transistor PT1 may receive the reference voltage VREF at its gate; may be coupled to the second common node CM2 at its drain; and may be coupled to the first output node ON1 at its source. The second compensation transistor PT2 may be coupled between the second common node CM2 and the second output node ON2 and may receive the input signal IN at its gate. The second compensation transistor PT2 may receive the input signal IN at its gate; may be coupled to the second common node CM2 at its drain; and may be coupled to the second output node ON2 at its source.

As described above, the compensation circuit 120 may have a connection relationship complementary to the input circuit 111. The compensation circuit 120 may compensate for the voltage level of the first output node ON1, which varies depending on the input signal IN, based on the reference voltage VREF. The compensation circuit 120 may compensate for the voltage level of the second output node ON2, which varies depending on the reference voltage VREF, based on the input signal IN. The first input transistor IT1 within the input circuit 111 may change the voltage level of the first output node ON1 based on the input signal IN while the first compensation transistor PT1 within the compensation circuit 120 may change the voltage level of the first output node ON1 based on the reference voltage VREF. The second input transistor IT2 within the input circuit 111 may change the voltage level of the second output node ON2 based on the reference voltage VREF while the second compensation transistor PT2 within the compensation circuit 120 may change the voltage level of the second output node ON2 based on the input signal IN. When the input signal IN has a logic high level, the voltage level of the first output node ON1 may rise when compared with the voltage level of the second output node ON2; and the first compensation transistor PT1 may additionally raise the voltage level of the first output node ON1. When the input signal IN has a logic low level, the voltage level of the second output node ON2 may rise when compared with the voltage level of the first output node ON1; and the second compensation transistor PT2 may additionally raise the voltage level of the second output node ON2.

The compensation circuit 120 may compensate for the voltage levels of the first output node ON1 and the second output node ON2 based on change of a common mode. Therefore, the transistors configured to receive the input signal IN and the reference voltage VREF within the compensation circuit 120 may have relatively small sizes and relatively small current-driving forces when compared with the transistors configured to receive the input signal IN and the reference voltage VREF within the amplification circuit 110. The first input transistor IT1 and the second input transistor IT2 may have the same size as each other and the first compensation transistor PT1 and the second compensation transistor PT2 may have the same size as each other. The size of the first compensation transistor PT1 and the second compensation transistor PT2 may be smaller than the size of the first input transistor IT1 and the second input transistor IT2.

The second enablement circuit 130 may include a second enablement transistor ET2. The second enablement transistor ET2 may be a P-channel MOS transistor. The second enablement transistor ET2 may be coupled between the second common node CM2 and the node, which receives the first power voltage V1; and may receive the enablement signal EN at its gate. The second enablement transistor ET2 may receive the enablement signal EN at its gate; may be coupled to the node, which receives the first power voltage V1, at its source; and may be coupled to the second common node CM2 at its drain.

The input circuit 111 may receive the voltage, which is dropped by the resistive element DR, through the first common node CM1 while the compensation circuit 120 may receive the first power voltage V1 through the second common node CM2, which is electrically isolated from the first common node CM1. The first common node CM1 and the second common node CM2 may be electrically isolated from each other and a resistive element DR might not be provided within the second enablement circuit 130; and thus threshold voltage drop, which occurs when the first compensation transistor PT1 and the second compensation transistor PT2 (each of which is a N-channel MOS transistor) are turned on, may be compensated for. That is, the maximum voltage level that can be provided to the first output node ON1 and the second output node ON2 through the first input transistor IT1 and the second input transistor IT2 may become substantially the same as the maximum voltage level that can be provided to the first output node ON1 and the second output node ON2 through the first compensation transistor PT1 and the second compensation transistor PT2. Each threshold voltage of the first compensation transistor PT1 and the second compensation transistor PT2 may have a voltage level corresponding to a voltage level, which is dropped by the resistive element DR.

The slicer 140 may include a first inverter 141 and a second inverter 142. The first inverter 141 may receive the output signal OUT. The first inverter 141 may output the reception signal ROUT by inversely driving the output signal OUT. The second inverter 142 may receive the complementary output signal OUTB. The second inverter 142 may output the complementary reception signal ROUTB by inversely driving the complementary output signal OUTB.

Figure 2:
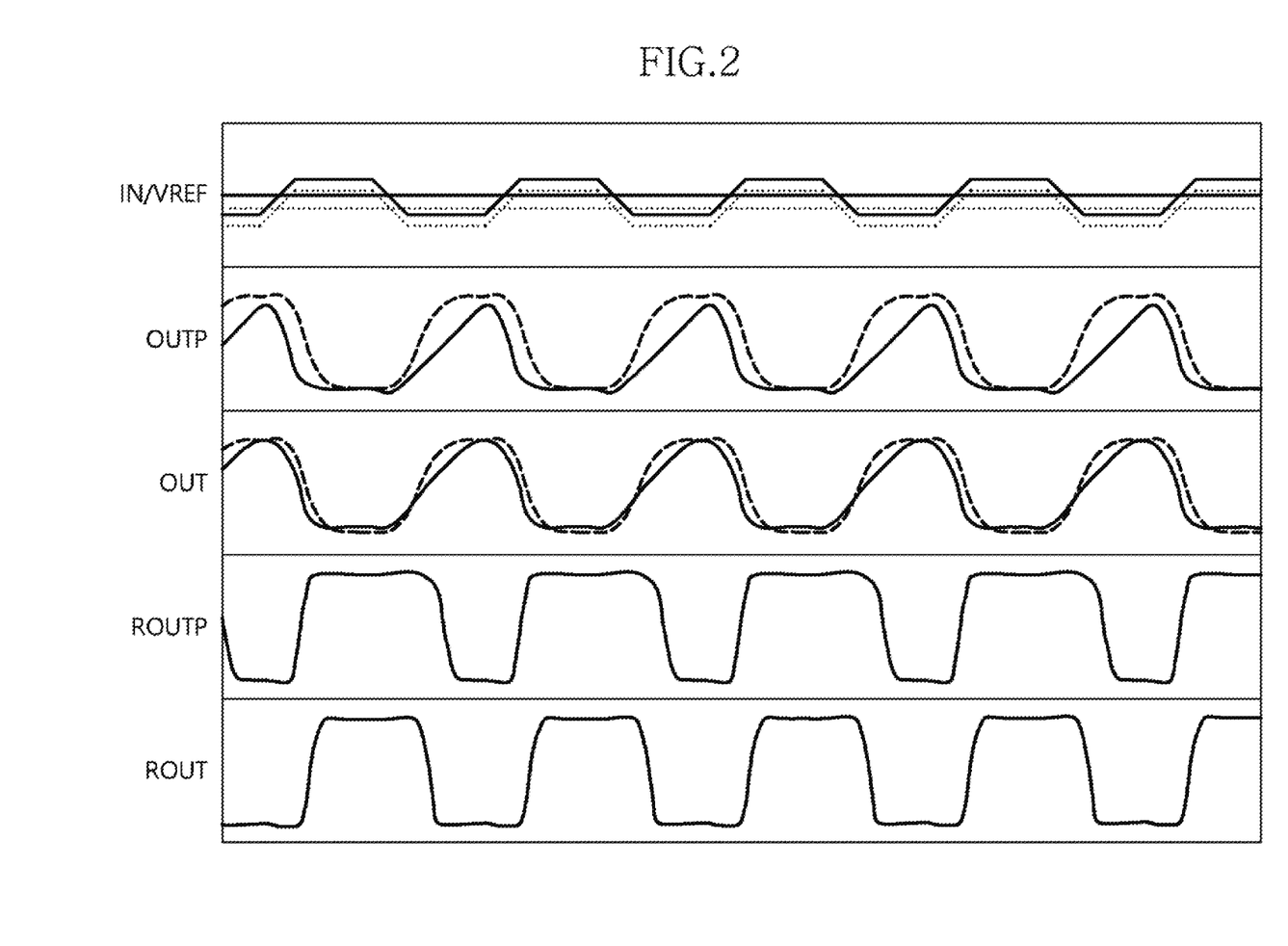
FIG. 2 is a timing diagram, illustrating an operation of the receiver, illustrated in FIG. 1.

FIG. 2 is a timing diagram, illustrating an operation of the receiver 100, illustrated in FIG. 1. Hereinafter, the operation of the receiver 100 will be described with reference to FIGS. 1 and 2. Referring to FIG. 2, the input signal IN may be a single-ended signal that swings within a range of a relatively low voltage level, as illustrated with a broken line. The reference voltage VREF may have a voltage level, corresponding to a middle, within the swing range of the input signal IN. Depending on a circumstance in which the receiver 100 operates, the voltage level of the swing range of the input signal IN and/or the voltage level of the reference voltage VREF may rise due to the change of a common mode, as illustrated with a solid line. When a semiconductor apparatus, including the receiver 100, is configured to operate with a low frequency and low power, the receiver 100 might not utilize the termination (No termination) and the change of the common mode may become serious. Furthermore, the voltage level of the reference voltage VREF may change based on a change in process or temperature. The amplification circuit 110 may include the first input transistor IT1 and the second input transistor IT2, each of which being a P-channel MOS transistor, to amplify an input signal that swings within a range of relatively low voltage level. In general, a P-channel MOS transistor has a fast response time for a gate voltage, having a low voltage level, and a slow response time for a gate voltage, having a high voltage level. Therefore, when the voltage level of one, between the input signal IN and the reference voltage VREF, rises, the amplification circuit 110 may be hard to perform a normal amplification operation.

<A Case where a Receiver does not Include a Compensation Circuit>

When receiving the input signal IN having a logic low level, the first input transistor IT1 may relatively raise the voltage level of the first output node ON1 in comparison to the voltage level of the second output node ON2. At this time, the common mode may change, the voltage level of the swing range of the input signal IN may rise, and the voltage level of the output signal OUTP (illustrated with a solid line), output from the first output node ON1, might not sufficiently rise to a target level (illustrated with a broken line). The target level may correspond to the voltage level, provided through the first common node CM1. When the voltage level of the output signal OUTP does not sufficiently rise to the target level, a section for the inverter 141 of the slicer 140, to have the voltage level over a threshold voltage, may become insufficient, and thus, a duty ratio of the reception signal ROUTP, output from the slicer 140, may become distorted. That is, the duty of a high-level section of the reception signal ROUTP may become greater than the duty of a low-level section of the reception signal ROUTP. When the duty ratio of the reception signal ROUT becomes distorted, the operation reliabilities of internal circuits, configured to operate based on the reception signal ROUT, may decrease.

<A Case where a Receiver Includes a Compensation Circuit>

In accordance with an embodiment, the receiver 100 may include the compensation circuit 120 and may compensate for the change of the common mode. The compensation circuit 120 may include a transistor, which is complementary to the transistor included in the amplification circuit 110. Thus, the compensation circuit 120 may detect the input signal IN, having the voltage level that the amplification circuit 110 cannot fully detect, and may compensate for the voltage levels of the output signal OUT and the complementary output signal OUTB. When the input signal IN has a logic low level, the first compensation transistor PT1 may pull-up drive the first output node ON1 based on the reference voltage VREF. Therefore, the output signal OUT (illustrated with a solid line) output from the first output node ON1 may be additionally pull-up driven and thus may, therefore, sufficiently rise to a target level (illustrated with a broken line). Thus, the duty ratio of the reception signal ROUT, output from the slicer 140, may be approximately 50:50. Therefore, the reception signal ROUT may have the improved duty ratio when compared with the reception signal ROUTP.

Figure 3:
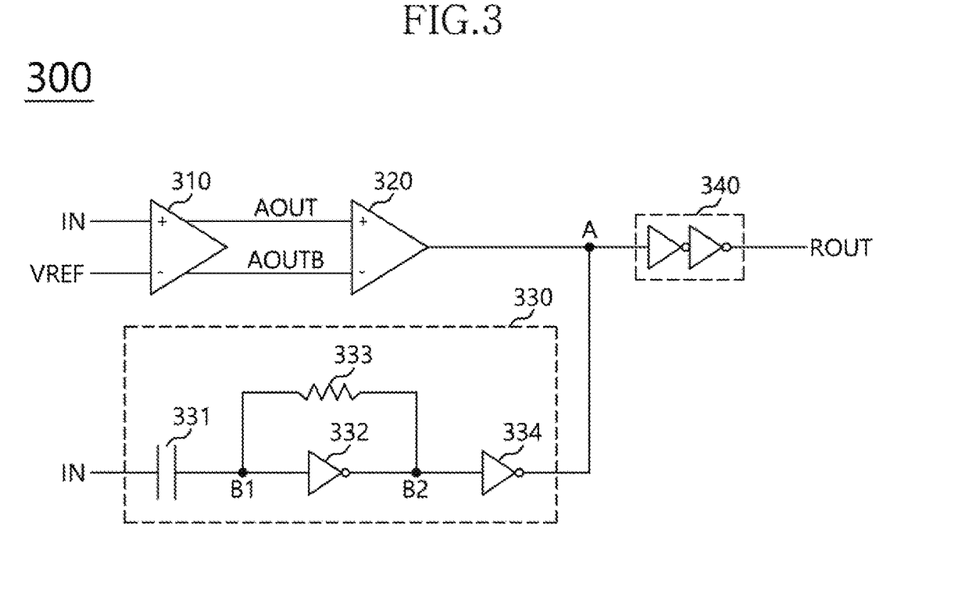
FIG. 3 is a schematic diagram, illustrating a configuration of a receiver, in accordance with an embodiment.

FIG. 3 is a schematic diagram, illustrating a configuration of a receiver 300, in accordance with an embodiment. The receiver 300 may include a first amplification circuit 310, a second amplification circuit 320 and a coupling circuit 330. The first amplification circuit 310 may receive the input signal IN and the reference voltage VREF and may generate an amplification signal AOUT by differentially amplifying the input signal IN and the reference voltage VREF. The first amplification circuit 310 may generate a complementary amplification signal AOUTB, together with the amplification signal AOUT. The second amplification circuit 320 may receive the amplification signal AOUT and the complementary amplification signal AOUTB and may generate the reception signal ROUT by differentially amplifying the amplification signal AOUT and the complementary amplification signal AOUTB. Each of the first amplification circuit 310 and the second amplification circuit 320 may include a general differential amplifier.

The coupling circuit 330 may receive the input signal IN. The coupling circuit 330 may change the voltage level of the reception signal ROUT based on the input signal IN. The coupling circuit 330 may be an AC coupling circuit. In order to operate as the AC coupling circuit, the coupling circuit 330 may include a high-pass filter. The coupling circuit 330 may change the voltage level of the reception signal ROUT, based on an AC component of the input signal IN, rather than a DC component of the input signal IN. For example, the coupling circuit 330 might not respond to the input signal IN when the input signal IN has a voltage level kept in a steady state. However, the coupling circuit 330 may change when the voltage level of the input signal IN changes the voltage level of the reception signal ROUT based on the change of the voltage level of the input signal IN. For example, when the voltage level of the input signal IN changes from a logic low level to a logic high level, the coupling circuit 330 may raise the voltage level of the reception signal ROUT based on the input signal IN. When the voltage level of the input signal IN changes from a logic high level to a logic low level, the coupling circuit 330 may lower the voltage level of the reception signal ROUT based on the input signal IN. The receiver 300 may further include a buffer 340. The buffer 340 may be coupled to an output node A of the second amplification circuit 320. The buffer 340 may buffer the signal, which is output from the second amplification circuit 320, the voltage level of which is compensated for by the coupling circuit 330, and may output the buffered signal as the reception signal ROUT. A delay amount of the coupling circuit 330 may be the same as the length of time from when the first amplification circuit 310 receives the input signal IN to when the second amplification circuit 320 outputs the reception signal ROUT.

The coupling circuit 330 may include a capacitor 331, a first inverter 332, a resistor 333, and a second inverter 334. The capacitor 331 may receive the input signal IN at one end, thereof, and may be coupled to a first node B1 at the other node, thereof. The first inverter 332 may be coupled to the first node B1 at its input node and may be coupled to a second node B2 at its output node. The resistor 333 may be coupled to the first node B1 at one end, thereof, and may be coupled to the second node B2 at the other end, thereof. The resistor 333 may be coupled to the first inverter 332 in parallel. The second inverter 334 may be coupled to the second node B2 at its input node and may be coupled to the output node A of the second amplification circuit 320 at its output node. The capacitor 331 may operate as a high-pass filter. When receiving the input signal IN, the capacitor 331 may output a signal corresponding to an AC component of the input signal IN to the first node B1. The first inverter 332 and the resistor 333 may invert the signal, provide through the first node B1, and may output the inverted signal to the second node B2. The resistor 333 may set a DC level of a pulse signal output from the capacitor 331 as a logic threshold level of the first inverter 332. The DC level may be the average value of the voltage level of the pulse signal output from the capacitor 331. Furthermore, the resistor 333 may form an AC peaking of the signal, output through the second node B2, by feeding the output of the first inverter 332 back to the input of the first inverter 332. The second inverter 334 may output the signal input through the second node B2 to the output node A of the second amplification circuit 320. Sizes of the first inverter 332 and the second inverter 334 may be very small to prevent increase of a whole load of the receiver 300.

Figure 4:
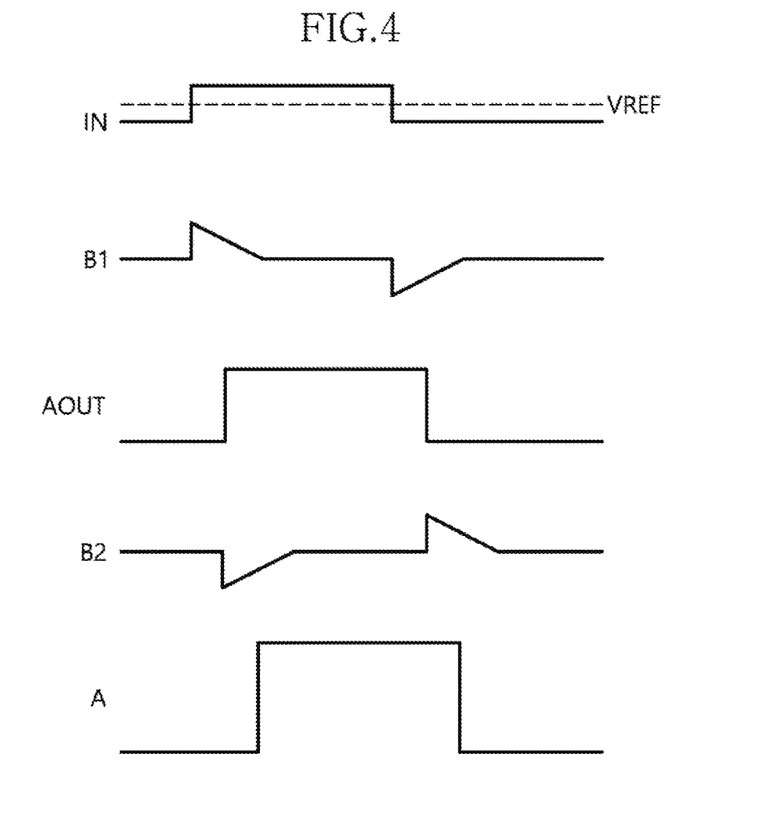
FIG. 4 is a timing diagram, illustrating an operation of the receiver, illustrated in FIG. 3.

FIG. 4 is a timing diagram, illustrating an operation of the receiver 300, illustrated in FIG. 3. Hereinafter, the operation of the receiver 300 will be described with reference to FIGS. 3 and 4. It is assumed that the voltage level of the input signal IN changes from a logic low level to a logic high level and then changes from a logic high level to a logic low level, with reference to the reference voltage VREF. When the voltage level of the input signal IN changes from a logic low level to a logic high level, the capacitor 331 may output a pulse signal of a logic high level based on the change of the input signal IN. Because the capacitor 331 removes a DC component of the input signal IN, the capacitor 331 might not output the pulse signal when the input signal IN has a voltage level kept in a steady state (i.e., when the voltage level of the input signal IN keeps to a logic high level). The first inverter 332 may invert the pulse signal output from the capacitor 331 and may output the inverted signal. A delay amount of the first inverter 332 may correspond to an amount of time taken for the first amplification circuit 310 to amplify the input signal IN and generate the amplification signal AOUT. The second inverter 334 may invert the output of the first inverter 332 and output the inverted signal to the output node A of the second amplification circuit 320. The delay amount of the second inverter 334 may correspond to an amount of time taken for the second amplification circuit 320 to amplify the amplification signal AOUT and output the amplified signal to the output node A. Therefore, the output of the second inverter 334 and the signal output from the second amplification circuit 320 may be combined at the output node A substantially at the same time. When the voltage level of the output node A changes from a logic low level to a logic high level, the second inverter 334 may provide the pulse of a logic high level to the output node A and may, therefore, help the voltage level of the output node A to more promptly change to a logic high level.

When the voltage level of the input signal IN changes from a logic high level to a logic low level, the capacitor 331 may output a pulse signal of a logic low level based on the change of the input signal IN. The first inverter 332 may invert the pulse signal output from the capacitor 331 and may output the inverted signal. The second inverter 334 may invert the output of the first inverter 332 and output the inverted signal to the output node A of the second amplification circuit 320. When the voltage level of the output node A changes from a logic high level to a logic low level, the second inverter 334 may provide the pulse of a logic low level to the output node A and may, therefore, help the voltage level of the output node A to more promptly change to a logic low level.

Figure 5:
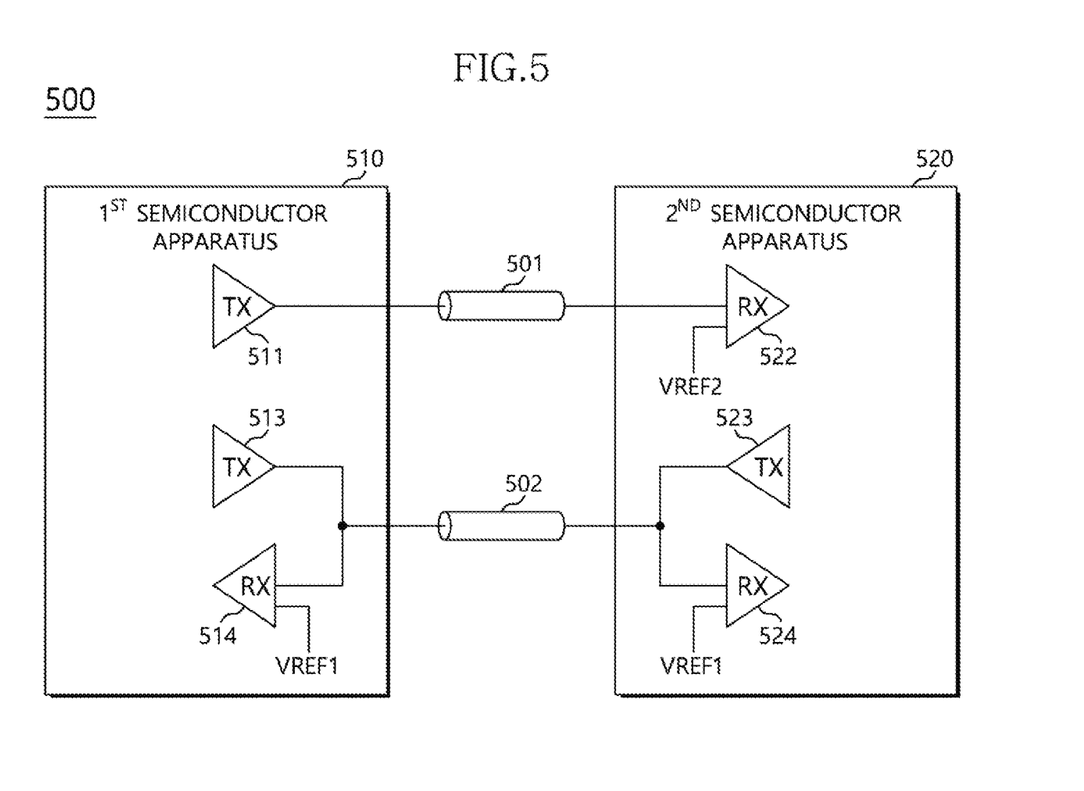
FIG. 5 is a schematic diagram, illustrating a configuration of a semiconductor system, in accordance with an embodiment.

FIG. 5 is a schematic diagram, illustrating a configuration of a semiconductor system 500, in accordance with an embodiment. Referring to FIG. 5, the semiconductor system 500 may include a first semiconductor apparatus 510 and a second semiconductor apparatus 520. The first semiconductor apparatus 510 may provide various control signals required for the second semiconductor apparatus 520 to operate. The first semiconductor apparatus 510 may include various types of devices. For example, the first semiconductor apparatus 510 may be a host device such as a central processing unit (CPU), a graphic processing unit (GPU), a multi-media processor (MMP), a digital signal processor, an application processor (AP), and a memory controller. For example, the second semiconductor apparatus 520 may be a memory device, and the memory device may include a volatile memory and a non-volatile memory. The volatile memory may include a static random access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth.

The second semiconductor apparatus 520 may be coupled to the first semiconductor apparatus 510 through a first bus 501 and a second bus 502. Each of the first bus 501 and the second bus 502 may be a signal transmission path, a link or a channel, configured to transfer a signal. The first bus 501 may be a one-way bus. The first semiconductor apparatus 510 may transmit a first signal TS1 to the second semiconductor apparatus 520 through the first bus 501. The second semiconductor apparatus 520 may be coupled to the first bus 501 and may receive the first signal TS1 transmitted from the first semiconductor apparatus 510. The first signal TS1 may be a single-ended signal. The first signal TS1 may include control signals, for example, such as a command signal, a clock signal and an address signal. The second bus 502 may be a two-way bus. The first semiconductor apparatus 510 may transmit a second signal TS2 to the second semiconductor apparatus 520 through the second bus 502 and may receive the second signal TS2 transmitted from the second semiconductor apparatus 520 through the second bus 502. The second semiconductor apparatus 520 may transmit the second signal TS2 to the first semiconductor apparatus 510 through the second bus 502 and may receive the second signal TS2 transmitted from the first semiconductor apparatus 510 through the second bus 502. The second signal TS2 may be a single-ended signal. For example, the second signal TS2 may be data.

The first semiconductor apparatus 510 may include a first transmitting circuit (TX) 511, a second transmitting circuit (TX) 513 and a receiving circuit (RX) 514. The first transmitting circuit 511 may be coupled to the first bus 501 and may transmit the first signal TS1 to the second semiconductor apparatus 520 by driving the first bus 501 based on an internal signal within the first semiconductor apparatus 510. The second transmitting circuit 513 may be coupled to the second bus 502 and may transmit the second signal TS2 to the second semiconductor apparatus 520 by driving the second bus 502 based on an internal signal within the first semiconductor apparatus 510. The receiving circuit 514 may be coupled to the second bus 502 and may receive the second signal TS2 transmitted from the second semiconductor apparatus 520 through the second bus 502. The receiving circuit 514 may generate an internal signal, which is to be utilized within the first semiconductor apparatus 510, by differentially amplifying the second signal TS2 transmitted from the second semiconductor apparatus 520 through the second bus 502. The receiving circuit 514 may utilize a first reference signal VREF1 in order to receive the second signal TS2. The receiving circuit 514 may generate the internal signal by differentially amplifying the second signal TS2 and the first reference signal VREF1. The first reference signal VREF1 may have a voltage level corresponding to a middle of a swing range of the second signal TS2. The receiving circuit 514 may include at least one of the receivers 100 and 300, illustrated in FIGS. 1 and 3.

The second semiconductor apparatus 520 may include a first receiving circuit (RX) 522, a transmitting circuit (TX) 523 and a second receiving circuit (RX) 524. The first receiving circuit 522 may be coupled to the first bus 501 and may receive the first signal TS1 transmitted from the first semiconductor apparatus 510 through the first bus 501. The first receiving circuit 522 may generate an internal signal, which is to be utilized within the second semiconductor apparatus 520, by differentially amplifying the first signal TS1 transmitted from the first semiconductor apparatus 510 through the first bus 501. The first receiving circuit 522 may utilize a second reference signal VREF2 in order to receive the first signal TS1. The first receiving circuit 522 may generate the internal signal by differentially amplifying the first signal TS1 and the second reference signal VREF2. The second reference signal VREF2 may have a voltage level corresponding to a middle of a swing range of the first signal TS1. The transmitting circuit 523 may be coupled to the second bus 502 and may transmit the second signal TS2 to the first semiconductor apparatus 510 by driving the second bus 502 based on an internal signal within the second semiconductor apparatus 520. The second receiving circuit 524 may be coupled to the second bus 502 and may receive the second signal TS2 transmitted from the first semiconductor apparatus 510 through the second bus 502. The second receiving circuit 524 may generate an internal signal, which is to be utilized within the second semiconductor apparatus 520, by differentially amplifying the second signal TS2 transmitted from the first semiconductor apparatus 510 through the second bus 502. When a pair of differential signals are transmitted through the second bus 502, the second receiving circuit 524 may generate the internal signal by differentially amplifying the second signal TS2 and a complementary signal TS2B of the second signal TS2. When a single-ended signal is transmitted through the second bus 502, the second receiving circuit 524 may generate the internal signal by differentially amplifying the second signal TS2 and the first reference signal VREF1. Each of the first receiving circuit 522 and the second receiving circuit 524 may include at least one of the receivers 100 and 300, illustrated in FIGS. 1 and 3.

Figure 6:
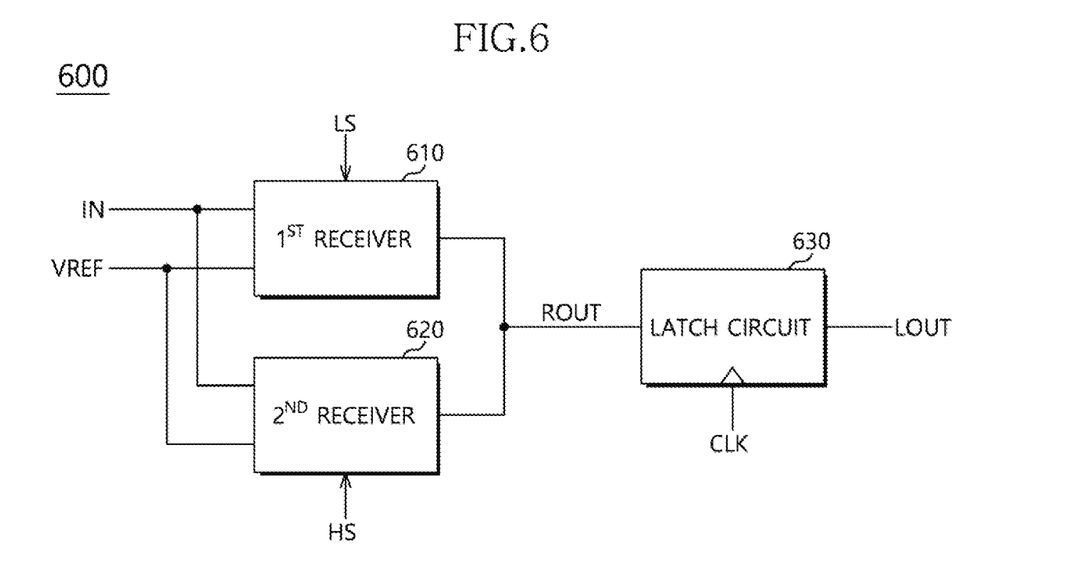
FIG. 6 is a schematic diagram, illustrating a configuration of a receiving circuit, in accordance with an embodiment.

FIG. 6 is a schematic diagram, illustrating a configuration of a receiving circuit 600, in accordance with an embodiment. Referring to FIG. 6, the receiving circuit 600 may be applied as at least one of the receiving circuit 514, the first receiving circuit 522 and the second receiving circuit 524, which are illustrated in FIG. 5. The receiving circuit 600 may include a first receiver 610, a second receiver 620 and a latch circuit 630. Each of the first receiver 610 and the second receiver 620 may receive the input signal IN and the reference voltage VREF. The first receiver 610 may operate in a low-frequency mode and the second receiver 620 may operate in a high-frequency mode. The first receiver 610 may be activated on a basis of a low-frequency mode signal LS. When the low-frequency mode signal LS is enabled, the first receiver 610 may generate the reception signal ROUT by differentially amplifying the input signal IN and the reference voltage VREF. The first receiver 610 may be a single-stage amplification circuit, including a single amplification circuit. The second receiver 620 may be activated on a basis of a high-frequency mode signal HS. When the high-frequency mode signal HS is enabled, the second receiver 620 may generate the reception signal ROUT by differentially amplifying the input signal IN and the reference voltage VREF. The second receiver 620 may be a multi-stage amplification circuit including at least two amplification circuits.

The low-frequency mode signal LS may be enabled in a low-frequency mode, and the high-frequency mode signal HS may be enabled in a high-frequency mode. The low-frequency mode signal LS and the high-frequency mode signal HS may be selectively enabled based on the circumstance in which the receiving circuit 600 operates. A semiconductor apparatus, including the receiving circuit 600, may enable at least one of the low-frequency mode signal LS and the high-frequency mode signal HS based on an operation speed or a frequency of a clock signal of the semiconductor apparatus. The receiver 100, illustrated in FIG. 1, may be applied as the first receiver 610. The receiver 300, illustrated in FIG. 3, may be applied as the second receiver 620. The receiver 100 may be modified to be activated based on the low-frequency mode signal LS. The receiver 300 may be modified to be activated based on the high-frequency mode signal HS.

In the low-frequency mode, the low-frequency mode signal LS may be enabled, and the first receiver 610, configured by a single stage, may generate the reception signal ROUT by amplifying the input signal IN and the reference voltage VREF. Because the first receiver 610 includes a single stage, the first receiver 610 may minimize power consumption when receiving the input signal IN. In the high-frequency mode, the high-frequency mode signal HS may be enabled, and the second receiver 620, configured by at least two stages, may generate the reception signal ROUT by amplifying the input signal IN and the reference voltage VREF. Because the second receiver 620 can be configured by at least two stages, the second receiver 620 may readily restore the common mode even when the second receiver 620 ages and the common mode changes. Therefore, the second receiver 620 may precisely amplify an input signal of a high frequency to generate a reception signal.

The latch circuit 630 may receive the reception signal ROUT and may output a latch signal LOUT. The latch circuit 630 may receive a clock signal CLK and may latch the reception signal ROUT based on the clock signal CLK. The latch circuit 630 may generate the latch signal LOUT by synchronizing the reception signal ROUT with the clock signal CLK. For example, the latch circuit 630 may latch the voltage level of the reception signal ROUT in synchronization with an edge of the clock signal CLK and may output the latched signal as the latch signal LOUT. The latch signal LOUT may be input to an internal circuit, coupled to the receiving circuit 600, and may be utilized for an operation of the internal circuit.

While certain embodiments have been described above, it will be understood to those skilled in the art that the embodiments described are by way of example only. Accordingly, the receiver, receiving circuit, semiconductor apparatus, and semiconductor system including the receiver should not be limited based on the described embodiments. Rather, the receiver, receiving circuit, semiconductor apparatus, and semiconductor system including the receiver described herein should only be limited in light of the claims that follow when taken in conjunction with the above description and accompanying drawings.

What is claimed is:

1. A receiver comprising:
    a first enablement circuit configured to couple a node, which receives a first power voltage, and a first common node to each other;
    an input circuit, coupled between the first common node and a first output node and a second output node, configured to change a voltage level of the first output node based on an input signal and change a voltage level of the second output node based on a reference voltage;
    a current circuit configured to allow the same amount of currents to flow through the first output node and the second output node; and
    a compensation circuit configured to receive the first power voltage through a second common node, configured to couple the second common node to the second output node based on the input signal, and configured to couple the second common node to the first output node based on the reference voltage.

2. The receiver of claim 1, wherein the first enablement circuit includes:
    a resistive element coupled to the node, which receives the first power voltage, at one end thereof; and
    a first enablement transistor, coupled between the other end of the resistive element and the first common node, configured to receive an enablement signal at its gate.

3. The receiver of claim 1, wherein the input circuit includes:
    a first input transistor, coupled between the first common node and the first output node, configured to receive the input signal at its gate; and
    a second input transistor, coupled between the first common node and the second output node, configured to receive the reference voltage at its gate.

4. The receiver of claim 1, wherein the current circuit includes:
    a first current transistor coupled between the first output node and a node, to which a second power voltage is provided and coupled to the second output node at its gate; and
    a second current transistor, coupled between the second output node and the node, which receives the second power voltage, and coupled to the second output node at its gate.

5. The receiver of claim 1, wherein the compensation circuit pull-up drives the second output node when the input signal has a logic high level, and pull-up drives the first output node when the input signal has a logic low level.

6. The receiver of claim 1, wherein the compensation circuit includes:
    a first compensation transistor, coupled between the second common node and the first output node, configured to receive the reference voltage at its gate; and
    a second compensation transistor, coupled between the second common node and the second output node, configured to receive the input signal at its gate.

7. The receiver of claim 2, further comprising a second enablement circuit,
    wherein the second enablement circuit includes a second enablement transistor coupled between the node, which receives the first power voltage, and the second common node, and is configured to receive the enablement signal at its gate.

8. A receiver comprising:
    a first input transistor configured to receive an input signal and configured to change a voltage level of a first output node;
    a second input transistor configured to receive a reference voltage and configured to change a voltage level of a second output node;
    a resistive element configured to couple a node, which receives a first power voltage, and the first and second input transistors to each other;
    a current circuit configured to provide the first output node and the second output node with a second power voltage;
    a first compensation transistor configured to change the voltage level of the first output node based on the reference voltage; and
    a second compensation transistor configured to change the voltage level of the second output node based on the input signal.

9. The receiver of claim 8, wherein a type of the first and second input transistors and a type of the first and second compensation transistors structurally mirror each other.

10. The receiver of claim 8, wherein the first and second compensation transistors have smaller sizes than the first and second input transistors.

11. The receiver of claim 8, wherein the second input transistor raises the voltage level of the second output node with reference to the voltage level of the first output node, and the second compensation transistor additionally raises the voltage level of the second output node, when the input signal has a logic high level.

12. The receiver of claim 8, wherein the first input transistor raises the voltage level of the first output node with reference to the voltage level of the second output node, and the first compensation transistor additionally raises the voltage level of the first output node, when the input signal has a logic low level.

13. The receiver of claim 8, wherein the current circuit includes:
    a first current transistor coupled between the first output node and a node, which receives the second power voltage, and coupled to the second output node at its gate; and
    a second current transistor, coupled between the second output node and the node, which receives the second power voltage, and coupled to the second output node at its gate.

14. A receiver comprising:
    an amplification circuit, including first type transistors, configured to receive an input signal and a reference voltage, configured to change a voltage level of a first output node based on the input signal, and configured to change a voltage level of a second output node based on the reference voltage; and a compensation circuit, including second type transistors, configured to receive the input signal and the reference voltage, configured to change the voltage level of the second output node based on the input signal, and configured to change the voltage level of the first output node based on the reference voltage.

15. The receiver of claim 14, wherein the amplification circuit includes:
   a first P-channel MOS transistor, coupled between a first common node, which receives a first power voltage, and the first output node, configured to receive the input signal at its gate; and
   a second P-channel MOS transistor, coupled between the first common node and the second output node, configured to receive the reference voltage at its gate.

16. The receiver of claim 15, wherein the compensation circuit includes:
   a first N-channel MOS transistor, coupled between a second common node, which receives the first power voltage, and the first output node, configured to receive the reference voltage at its gate; and
   a second N-channel MOS transistor, coupled between the second common node and the second output node, configured to receive the input signal at its gate.

17. The receiver of claim 16, wherein the first and second P-channel MOS transistors have greater sizes than the first and second N-channel MOS transistors.

18. The receiver of claim 15, wherein the amplification circuit further includes:
   a resistive element coupled between a node, which receives the first power voltage, and the first common node; and
   a current circuit configured to couple the first and second output nodes to a node, which receives a second power voltage.

19. The receiver of claim 18, wherein the current circuit includes:
   a first current transistor coupled between the first output node and the node, which receives the second power voltage is provided, and coupled to the second output node at its gate; and
   a second current transistor coupled between the second output node and the node, which receives the second power voltage is provided, and coupled to the second output node at its gate.

20. A receiving circuit comprising:
   a first receiver configured to generate, in a low-frequency mode, a reception signal by differentially amplifying an input signal and a reference voltage; and
   a second receiver configured to generate, in a high-frequency mode, the reception signal by differentially amplifying the input signal and the reference voltage,
   wherein the first receiver includes:
   an amplification circuit configured to change a voltage level of an output signal based on the input signal and change a voltage level of a complementary output signal based on the reference voltage;
   a compensation circuit configured to change the voltage level of the output signal based on the reference voltage and change the voltage level of the complementary output signal based on the input signal; and
   a slicer configured to generate the reception signal by inversely driving the output signal.

21. The receiving circuit of claim 20, wherein the amplification circuit, with first type transistors, configured to receive the input signal and the reference voltage, and
   wherein the compensation circuit, with second type transistors, configured to receive the input signal and the reference voltage.

22. The receiving circuit of claim 21, wherein each of the first type transistors is a P-channel MOS transistor, and each of the second type transistors is a N-channel MOS transistor.

23. The receiving circuit of claim 20, wherein the amplification circuit includes:
   a resistive element configured to couple a node, which receives first power voltage, and a first common node to each other;
   a first input transistor coupled between the first common node and a first output node and configured to receive the input signal at its gate, the output signal being output from the first output node;
   a second input transistor, coupled between the first common node and a second output node, configured to receive the reference voltage at its gate, the complementary output signal being output from the second output node; and
   a current circuit configured to couple the first and second output nodes to a node, which receives second power voltage.

24. The receiving circuit of claim 23, wherein the current circuit includes:
   a first current transistor coupled between the first output node and the node, which receives the second power voltage, and coupled to the second output node at its gate; and
   a second current transistor coupled between the second output node and the node, which receives the second power voltage, and coupled to the second output node at its gate.

25. The receiving circuit of claim 23, wherein the compensation circuit includes:
   a first compensation transistor, coupled between a second common node, which receives the first power voltage is provided, and the first output node, configured to receive the reference voltage at its gate; and
   a second compensation transistor, coupled between the second common node and the second output node, configured to receive the input signal at its gate.

26. The receiving circuit of claim 20, wherein the second receiver includes:
   a first amplification circuit configured to generate a first amplification signal and a second amplification signal by amplifying the input signal and the reference voltage;
   a second amplification circuit configured to generate the reception signal by amplifying the first amplification signal and the second amplification signal; and
   a coupling circuit configured to change a voltage level of the reception signal based on the input signal.

27. The receiving circuit of claim 26, wherein the coupling circuit changes when a voltage level of the input signal changes the voltage level of the reception signal.

28. The receiving circuit of claim 26, wherein the coupling circuit includes a high-pass filter and changes the voltage level of the reception signal in response to an AC component of the input signal.

29. The receiving circuit of claim 26, wherein a delay amount of the coupling circuit is substantially the same as an amount of time from when the first amplification circuit receives the input signal to when the second amplification circuit outputs the reception signal.

\* \* \* \* \*